(12) United States Patent
Wu et al.

(10) Patent No.: US 7,118,778 B2
(45) Date of Patent: Oct. 10, 2006

(54) METHOD OF APPLYING ADHESIVE

(75) Inventors: Mifong Wu, Hsinchu (TW);
Chung-Chih Yeh, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 415 days.

(21) Appl. No.: 10/668,436

(22) Filed: Sep. 22, 2003

(65) Prior Publication Data
US 2004/0197473 A1 Oct. 7, 2004

(30) Foreign Application Priority Data
Apr. 1, 2003 (TW) .............................. 92107441 A

(51) Int. Cl.
*B05D 5/10* (2006.01)
(52) U.S. Cl. .............. 427/207.1; 427/240; 427/255.14; 427/255.6; 427/294; 427/407.1
(58) Field of Classification Search ................ 427/240, 427/207.1, 255.6, 255.14, 407.1, 294; 118/52
See application file for complete search history.

(56) References Cited

U.S. PATENT DOCUMENTS 5,681,614 A * 10/1997 Omori et al. ............ 427/248.1

2004/0216665 A1 * 11/2004 Soininen et al. ............ 118/715

* cited by examiner

*Primary Examiner*—Kirsten Jolley
(74) *Attorney, Agent, or Firm*—Townsend and Townsend and Crew LLP

(57) ABSTRACT

An applying method for an adhesive according to an embodiment includes the following steps. First, gas is exhausted from a first exhaust pipe, so as to eliminate a part of the gas in a closed container. Next, the gas continues to be exhausted from the first exhaust pipe, so as to have the adhesive in the transmission pipeline become bubbled, and also to convey the bubbled adhesive to reach the supply vent. Later, gas is exhausted from the second exhaust pipe and continues to be exhausted from the first exhaust pipe, so as to greatly exhaust the gas in the closed container, and also to increase bubbling in the adhesive. Subsequently, the gas continues to be exhausted from the second exhaust pipe and ceases to be exhausted from the first exhaust pipe, so as to cause the adhesive to reach a gasified state. Also the gasified adhesive is supplied to the closed container from the supply vent, so that the gasified adhesive can adhere to and coat above the $SiO_2$ layer. Finally, gas may be exhausted from the first exhaust pipe and ceases to be exhausted from the second exhaust pipe, so that the remaining gasified adhesive in the closed container is pumped out.

22 Claims, 3 Drawing Sheets

METHOD OF APPLYING ADHESIVE

CROSS-REFERENCES TO RELATED APPLICATIONS

This application claims priority from R.O.C. Patent Application No. 092107441, filed Apr. 1, 2003, the entire disclosure of which is incorporated herein by reference.

BACKGROUND OF THE INVENTION

The invention relates in general to an applying method for an adhesive, and more particularly to an applying method for an adhesive used in micro-fabrication.

Generally speaking, a layer of adhesive, such as hexamethyldisilazane (HMDS), needs to be applied before applying a photoresist on a wafer with a $SiO_2$ layer formed on the entire wafer surface so that the photoresist can adhere to the $SiO_2$ layer in a process of photolithography used in micro-fabrication.

With reference to FIG. 1, a diagram of an apparatus used for applying an adhesive to a $SiO_2$ layer of a wafer is shown. A wafer 100 is placed in a closed container 110 with a supply vent 120, which is connected with a transmission pipeline 130 for conveying an adhesive to the closed container 110. The closed container 110 also includes an exhaust vent or outlet 125, and the exhaust vent 125 is externally connected to a first exhaust pipe 140 and a second exhaust pipe 150. The first exhaust pipe 140 is externally connected to a pump, which can exhaust gas from the closed container 110. The second exhaust pipe 150 is externally connected to a general air-extracting or gas-extracting common pipe, which utilizes the Bernoulli Principle to eliminate the gas in the closed container 110. By using the above-mentioned pump to exhaust the gas from the first exhaust pipe 140 the flow rate is greater than if only the Bernoulli Principle method is used to exhaust the gas from the second exhaust pipe 150.

Referring to FIG. 1 and FIG. 2 simultaneously, FIG. 2 shows a conventional method for applying an adhesive on a $SiO_2$ layer of a wafer. The method includes the following steps. First, in step 210, the coating process of applying an adhesive such as HMDS on an oxidation layer of the wafer 100 is begun. In step 220, gas is exhausted from the first exhaust pipe 140 so as to eliminate a part of the gas in the closed container 110. The operation time of this step is approximately five seconds. Next, in step 230, the gas continues to be exhausted from the first exhaust pipe 140 so as to cause bubbling in the adhesive in the transmission pipeline 130 and convey the bubbled adhesive to the supply vent 120. Operation time of this step is approximately five seconds. In step 240, the gas continues to be exhausted from the second exhaust pipe 150 and ceases to be exhausted from the first exhaust pipe 140. Thus the adhesive reaches a gasification state, and the gasified adhesive is supplied to the closed container 110 from the supply vent 120. The gasified adhesive can then adhere and be coated on the $SiO_2$ layer. The operation time of this step is approximately forty seconds. Next, in step 250, the gas is exhausted from the first exhaust pipe 140 and ceases to be exhausted from the second exhaust pipe 150, and the remaining gasified adhesive in the closed container 110 is pumped out. The operation time of this step is approximately seven seconds. Finally, in step 260, the coating process of applying the adhesive on the upper oxidation layer of the wafer 100 is accomplished. The method as mentioned above can be applied to such machines as the TEL-MK5Z (produced by Tokyo Electron Limited of Japan) and the like.

In order to coat the photoresist precisely and uniformly on the $SiO_2$ layer, a method of spin-coating is generally used. In spin-coating, a spinning apparatus drives the wafer 100 to rotate. The photoresist is dropped on the $SiO_2$ layer and moves toward to the edge of the $SiO_2$ layer due to the centrifugal force from spinning. In this way, a precisely and uniformly thick layer of the photoresist is eventually formed on the $SiO_2$ layer.

An objective of applying an adhesive as mentioned above is to have a $SiO_2$ layer coated with a photoresist in the following micro-fabrication, ensuring the photoresist adheres to the $SiO_2$ layer tightly. However, due to the influence of the centrifugal force resulting from the rotation of a spinner during the photoresist application process, the binding force of the adhesive is often insufficient, resulting in the photoresist instability and subsequent flaking off the $SiO_2$ layer. This is the so-called resist lifting issue. Therefore, the conventional applying method for an adhesive results in the photoresist degradation and flaking off the $SiO_2$ layer very easily.

BRIEF SUMMARY OF THE INVENTION

Embodiments of the present invention are directed to an applying method for an adhesive to ensure the photoresist adheres to a $SiO_2$ layer tightly without resulting in the photoresist instability and subsequent flaking off or resist lifting of the $SiO_2$ layer due to the insufficient binding force.

The present invention achieves the above-identified objective by providing an applying method for an adhesive on a $SiO_2$ layer of a wafer in a closed container. The closed container is connected with a transmission pipeline by a supply vent, and the transmission pipeline is used for conveying the adhesive to the closed container. The closed container also includes an exhaust vent which is externally connected with a first exhaust pipe and a second exhaust pipe. The applying method for the adhesive according to one embodiment of the present invention includes the following steps. First, gas is exhaust from the first exhaust pipe so as to eliminate a part of the gas in the closed container. Next, the gas continues to be exhausted from the first exhaust pipe so as to cause bubbling of the adhesive in the transmission pipeline and convey the bubbled adhesive to the supply vent. Later, the gas is exhausted from the second exhaust pipe and continues to be exhausted from the first exhaust pipe so as to greatly increase exhaust of the gas in the closed container and bubbling of the adhesive. Subsequently, the gas continues to be exhausted from the second exhaust pipe and ceases to be exhausted from the first exhaust pipe so as to have the adhesive reach a gasification state. The gasified adhesive is supplied to the closed container from the supply vent and the gasified adhesive can adhere and be coated on the $SiO_2$ layer. Next, the gas is exhausted from the first exhaust pipe and ceases to be exhausted from the second exhaust pipe, and the remaining gasified adhesive in the closed container is pumped out.

In another embodiment, a method of applying an adhesive on a wafer comprises placing the wafer in a closed container having a transmission line connected to an inlet of the closed container to supply the adhesive to the closed container, and a first exhaust line and a second exhaust line connected to an outlet of the closed container; bubbling the adhesive in the transmission line by exhausting a portion of gas from the closed container via the first exhaust line; enhancing bubbling of the adhesive in the transmission line by exhausting the gas from the closed container via the second exhaust line and continuing to exhaust the gas from the closed container via the first exhaust line; and gasifying the adhesive in the transmission line and flowing the gasified adhesive into the closed container via the inlet to adhere to and coat the wafer by continuing to exhaust the gas from the closed container via the second exhaust line and ceasing exhausting the gas from the closed container via the first exhaust line.

DETAILED DESCRIPTION OF THE INVENTION

Embodiments of the present invention are directed to an application method for adhering a photoresist tightly to a $SiO_2$ layer of a wafer to minimize resist lifting of the $SiO_2$ layer due to the insufficient binding force.

Figure 1:
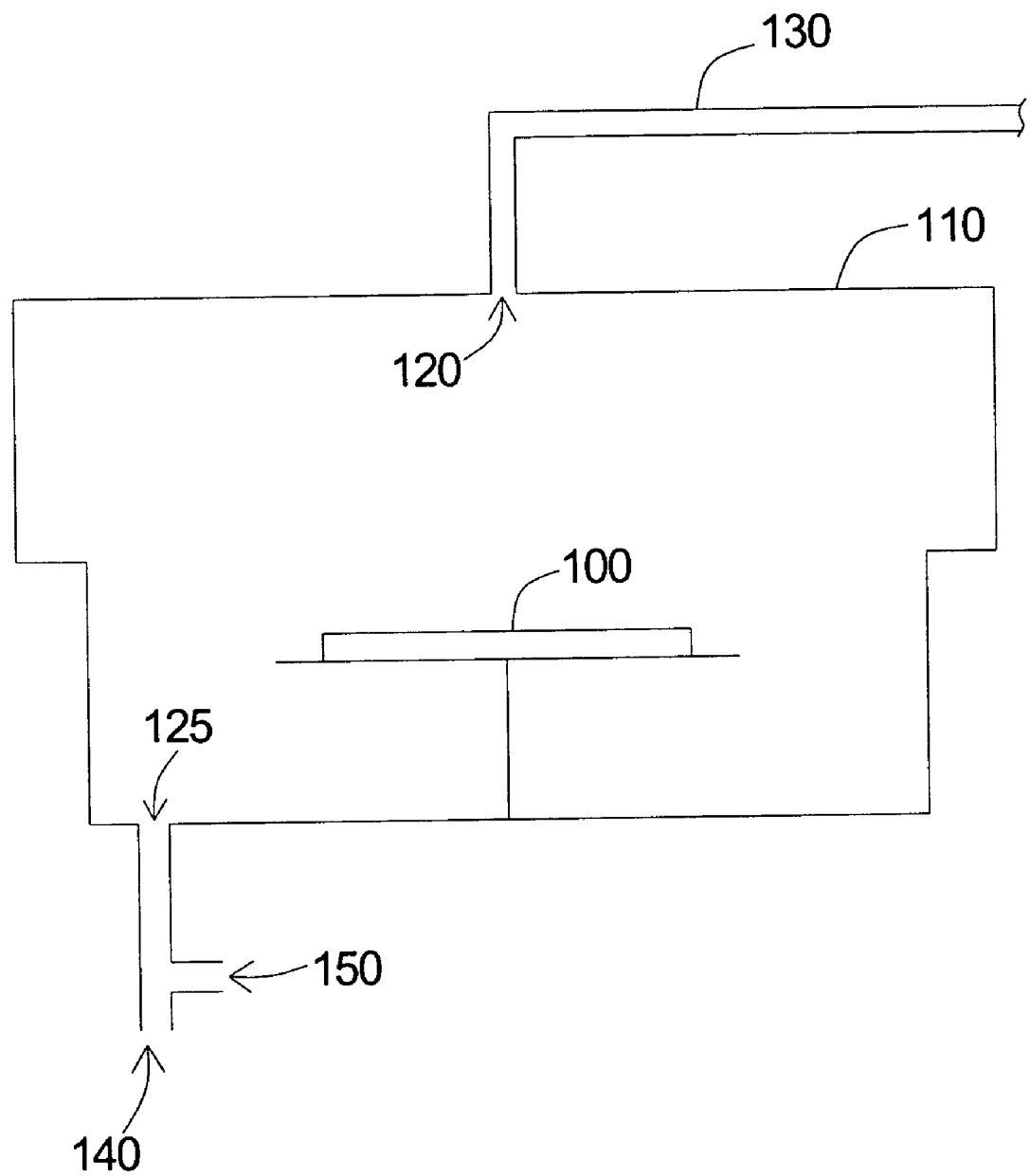
FIG. 1 is a simplified diagram of an apparatus used for applying an adhesive on a $SiO_2$ layer of a wafer.
Figure 3:
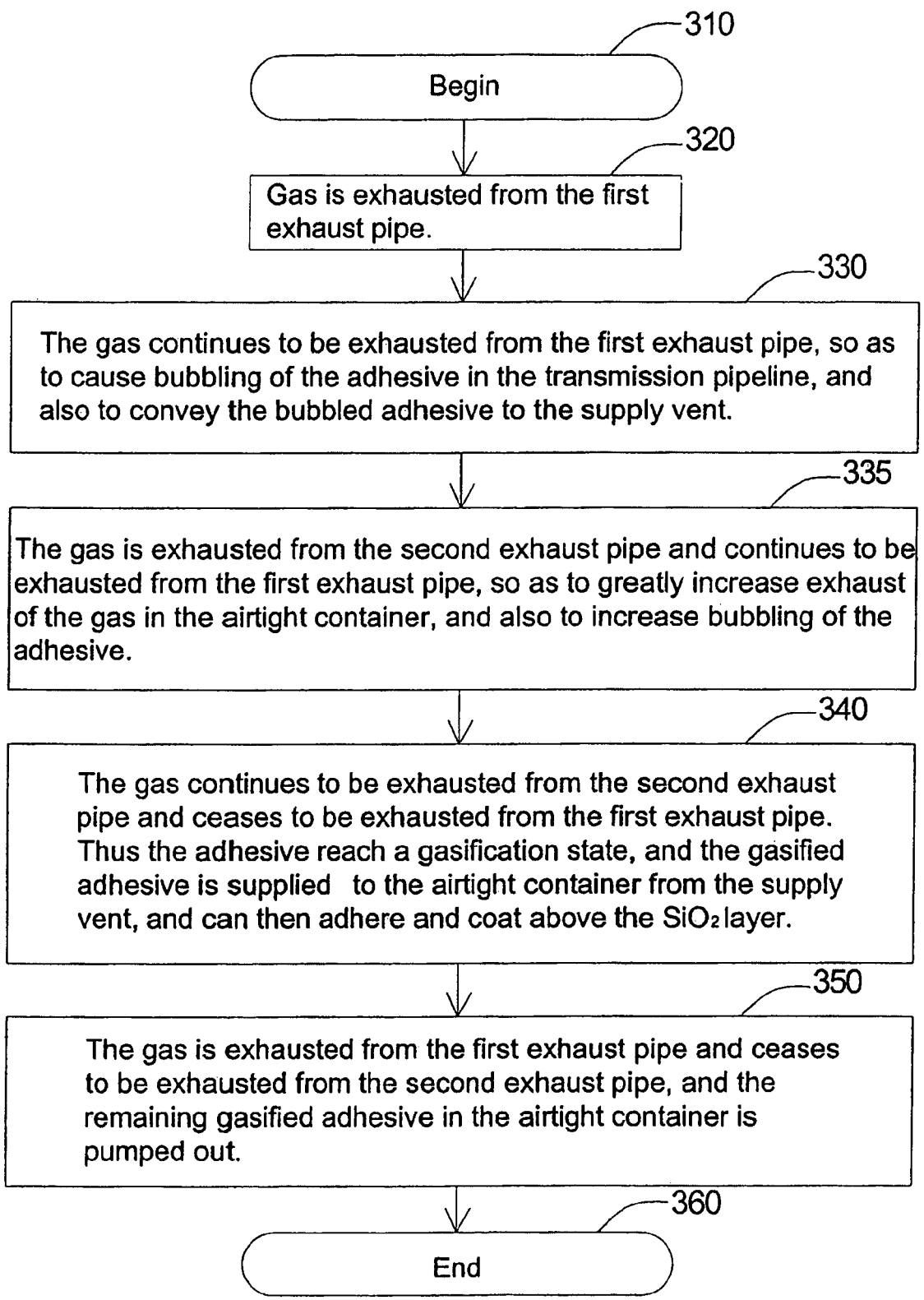
FIG. 3 is a flow diagram of the applying method for the adhesive on the $SiO_2$ layer of the wafer according to an embodiment of the present invention.

Referring to FIG. 1 and FIG. 3 simultaneously, FIG. 3 shows the method for applying an adhesive to a $SiO_2$ layer of a wafer according to an embodiment of the present invention. Using the same apparatus as the conventional applying method as shown in FIG. 1, the method for the present invention includes the following steps. First, in step 310, the coating process of applying an adhesive such as HMDS on the top of an oxidation layer of the wafer 100 is started. In step 320, gas is exhausted from the first exhaust pipe 140 so as to eliminate a part of the gas in a closed container 110. The operation time of this step typically is approximately five seconds. Next, in step 330, the gas continues to be exhausted from the first exhaust pipe 140 so as to cause bubbling of the adhesive in the transmission pipeline 130 and convey the bubbled adhesive to a supply vent or inlet 120. The operation time of this step typically is approximately five seconds. An objective of this step is not only to cause the adhesive to become bubbled, but also to exhaust the gas from the closed container 110. Later, in step 335, the gas is exhausted from the second exhaust pipe 150 and continues to be exhausted from the first exhaust pipe 140 so as to greatly increase exhaust of the gas in the closed container 110 and increase bubbling of the adhesive. The operation time of this step typically is approximately five seconds. An objective of this step is to approach vacuum conditions in the closed container 110 so that the adhesive becomes more bubbled and will be more precisely and uniformly coated on the $SiO_2$ layer. In supply step 340, the gas continues to be exhausted from the second exhaust pipe 150 and ceases to be exhausted from the first exhaust pipe 140 so as to have the adhesive reach a gasification state. The gasified adhesive is supplied to the closed container 110 from the supply vent 120 and the gasified adhesive can adhere to and be coated on the $SiO_2$ layer. In a reaction time of approximately forty seconds, the adhesive can achieve the optimum state. Next, in step 350, the gas is exhausted from the first exhaust pipe 140 and ceases to be exhausted from the second exhaust pipe 150, and the remaining gasified adhesive in the closed container 110 is pumped out. The operation time of this step typically is approximately seven seconds. Finally, in step 360, the coating process of applying the adhesive on the oxidation layer of the wafer 100 is accomplished. The method as mentioned above can be applied to a machine such as TEL-MK5Z (produced by Tokyo Electron Limited of Japan), and the like.

The above-mentioned applying method may be used prior to applying the photoresist on the $SiO_2$ layer. The adhesive ensures the photoresist adheres to the top of the $SiO_2$ layer. The applying method can be used in a liquid crystal display driver (LCD driver), a power integrated circuit (Power IC), or mask read only memory (Mask ROM), and the like.

Figure 2:
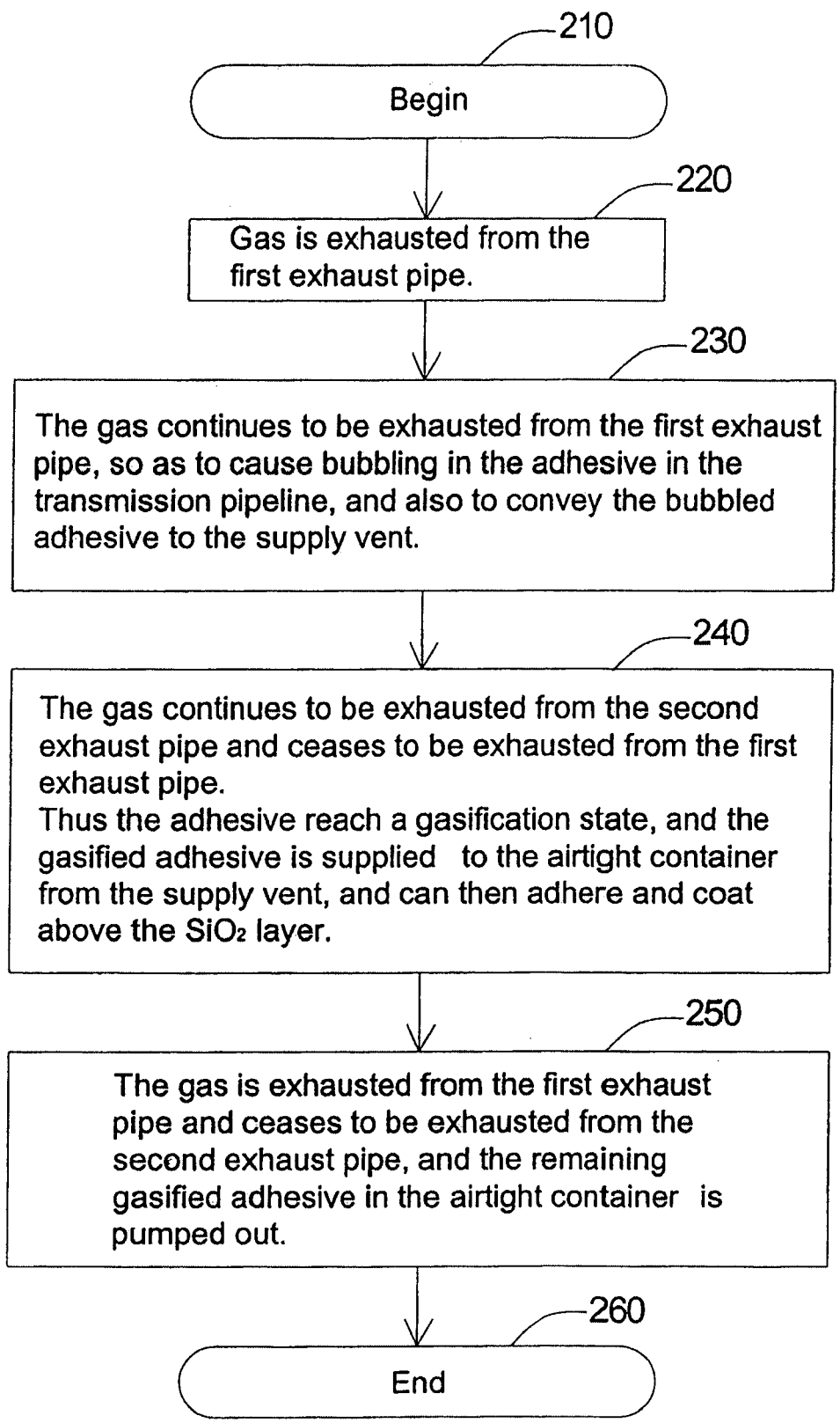
FIG. 2 is a flow diagram of a conventional method for applying an adhesive on a $SiO_2$ layer of a wafer.

It can be seen from the above that the present invention of a applying method for an adhesive can be compared with the conventional method. The present invention adds one more step as step 335 following step 330, which is the same as step 230 in FIG. 2. In addition to increasing the flow rate of gas exhausted from a first exhaust pipe 140 by using an exhaust pump, there is an increased flow rate as a result of the Bernoulli Principle. The gas exhausts externally from a second exhaust pipe 150 by using a general air-extracting or gas-extracting common pipe utilizing the Bernoulli Principle. Thereby, the volume of gas inside the closed container 110 decreases, and barometric pressure becomes much lower, increasing bubbling in the adhesive. On the other hand, by step 335, the extraction of $H_2O$ molecules adsorbed by the $SiO_2$ layer of the wafer may also occur. Both of these two points that can be achieved in step 335 will improve the adhesion of the adhesive to the $SiO_2$ layer. As a result, the photoresist will tightly and uniformly adhere with the adhesive to the $SiO_2$ layer in the wafer rotation process and will not flake off the $SiO_2$ layer.

The preferred embodiment as disclosed of the applying method for the adhesive according to the present invention will improve a tendency of the photoresist to flake off the $SiO_2$ layer in the rotation process of the spinner. Therefore, high yield rate of the wafer and low cost can be achieved.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. An applying method for an adhesive, which is provided to apply an adhesive on a $SiO_2$ layer of a wafer placed in an closed container, wherein the closed container is connected with a transmission pipeline by a supply vent, wherein the transmission pipeline is used for conveying the adhesive to the closed container, wherein the closed container also includes an exhaust vent, wherein the exhaust vent is externally connected with a first exhaust pipe coupled with a vacuum pump and a second exhaust pipe coupled with a gas-extracting tube, and wherein the applying method comprising:

(a) exhausting gas from the first exhaust pipe, so as to eliminate a part of the gas in the closed container;

(b) continuing to exhaust the gas from the first exhaust pipe so as to cause bubbling of the adhesive in the transmission pipeline and convey bubbled adhesive to the supply vent;

(c) exhausting the gas from the second exhaust pipe and continuing to exhaust the gas from the first exhaust pipe so as to greatly increase exhaust of the gas in the closed container and increase bubbling of the adhesive; and (d) continuing to exhaust the gas from the second exhaust pipe and ceasing exhausting the gas from the first exhaust pipe so as to have the adhesive reach a gasification state, wherein the gasified adhesive is supplied to the closed container from the supply vent, and wherein the gasified adhesive is adhered and coated on the $SiO_2$ layer.

2. The applying method as recited in claim 1, wherein operation time of the step (a) is approximately five seconds.

3. The applying method as recited in claim 1, wherein operation time of the step (b) is approximately five seconds.

4. The applying method as recited in claim 1, wherein operation time of the step (c) is approximately five seconds.

5. The applying method as recited in claim 1, wherein operation time of the step (d) is approximately forty seconds.

6. The applying method as recited in claim 1, further comprising:
   (e) exhausting the gas from the first exhaust pipe and ceasing exhausting the gas from the second exhaust pipe, wherein the remaining gasified adhesive in the closed container is pumped out, and wherein operation time of the step (e) is approximately seven seconds.

7. The applying method as recited in claim 1, wherein a gas-extracting flow rate of the first exhaust pipe is greater than a gas-extracting flow rate of the second exhaust pipe.

8. The applying method as recited in claim 1, wherein the adhesive is coated on the $SiO_2$ layer prior to applying a photoresist on the $SiO_2$ layer.

9. The applying method as recited in claim 8, wherein the adhesive is coated on the $SiO_2$ layer to adhere the photoresist on the $SiO_2$ layer.

10. The applying method as recited in claim 1, wherein the adhesive comprises hexamethyldisilazane (HMDS).

11. The applying method as recited in claim 1, which is provided in micro-fabrication of devices including devices selected from the group consisting of a liquid crystal display driver (LCD Driver), a power integrated circuit (Power IC), and a mask read only memory (Mask ROM).

12. A method of applying an adhesive on a wafer, the method comprising:
   (a) placing the wafer in a closed container having a transmission line connected to an inlet of the closed container to supply the adhesive to the closed container, and a first exhaust line and a second exhaust line connected to an outlet of the closed container, the first exhaust line coupled with a vacuum pump and the second exhaust line coupled with a gas-extracting tube;
   (b) bubbling the adhesive in the transmission line by exhausting a portion of gas from the closed container via the first exhaust line;
   (c) enhancing bubbling of the adhesive in the transmission line by exhausting the gas from the closed container via the second exhaust line and continuing to exhaust the gas from the closed container via the first exhaust line; and
   (d) gasifying the adhesive in the transmission line and flowing the gasified adhesive into the closed container via the inlet to adhere to and coat the wafer by continuing to exhaust the gas from the closed container via the second exhaust line and ceasing exhausting the gas from the closed container via the first exhaust line.

13. The method as recited in claim 12, wherein a gas-extracting flow rate of the first exhaust line is greater than a gas-extracting flow rate of the second exhaust line.

14. The method as recited in claim 12, wherein the first exhaust line is connected to a pump, and the second exhaust line is connected to a gas-extracting line without a pump.

15. The method as recited in claim 12, wherein the adhesive is coated on a $SiO_2$ layer on the wafer prior to applying a photoresist on the $SiO_2$ layer.

16. The method as recited in claim 15, wherein the adhesive is coated on the $SiO_2$ layer to adhere the photoresist onto the $SiO_2$ layer.

17. The method as recited in claim 12, wherein the adhesive comprises hexamethyldisilazane (HMDS).

18. The method as recited in claim 12, further comprising:
   (e) removing remaining gasified adhesive in the closed container by exhausting the gas from the closed container via the first exhaust line while ceasing exhausting the gas from the closed container via the second exhaust line.

19. The method as recited in claim 18, wherein the operation time of the step (b) is about ten seconds, the operation time of the step (c) is about five seconds, the operation time of the step (d) is about forty seconds, and the operation time of the step (e) is about seven seconds.

20. A method of applying an adhesive on a wafer, the method comprising:
   (a) placing the wafer in a closed container having a transmission line connected to an inlet of the closed container to supply the adhesive to the closed container, and a first exhaust line and a second exhaust line connected to an outlet of the closed container, the first exhaust line being coupled to a vacuum pump to pump from the closed container, the second exhaust line having no pump coupled thereto;
   (b) bubbling the adhesive in the transmission line by pumping gas from the closed container via the first exhaust line;
   (c) enhancing bubbling of the adhesive in the transmission line by exhausting the gas from the closed container via the second exhaust line and continuing to pump the gas from the closed container via the first exhaust line; and
   (d) gasifying the adhesive in the transmission line and flowing the gasified adhesive into the closed container via the inlet to adhere to and coat the wafer by continuing to exhaust the gas from the closed container via the second exhaust line and ceasing pumping the gas from the closed container via the first exhaust line.

21. The method of claim 20, further comprising:
   (e) removing remaining gasified adhesive in the closed container by pumping the gas from the closed container via the first exhaust line while ceasing exhausting the gas from the closed container via the second exhaust line.

22. The method as recited in claim 20, wherein the adhesive is coated on a $SiO_2$ layer on the wafer prior to applying a photoresist on the $SiO_2$ layer to adhere the photoresist onto the $SiO_2$ layer.

* * * * *